United States Patent
Otsuki

[11] Patent Number: 5,891,759
[45] Date of Patent: Apr. 6, 1999

[54] METHOD OF MAKING A MULTIPLE HEAT SINK RESIN SEALING TYPE SEMICONDUCTOR DEVICE

[75] Inventor: Tetsuya Otsuki, Suwa, Japan

[73] Assignee: Seiko Epson Corporation, Tokyo, Japan

[21] Appl. No.: 731,239

[22] Filed: Oct. 11, 1996

Related U.S. Application Data

[62] Division of Ser. No. 358,621, Dec. 14, 1994, Pat. No. 5,594,282.

[30] Foreign Application Priority Data

Dec. 16, 1993 [JP] Japan .................................. 5-316963
Nov. 8, 1994 [JP] Japan .................................. 6-298748

[51] Int. Cl.⁶ ......................... H01L 21/52; H01L 21/56; H01L 21/58; H01L 21/60
[52] U.S. Cl. ......................... 438/122; 438/122; 438/125
[58] Field of Search ..................... 437/216, 902; 257/675; 438/122, 125

[56] References Cited

U.S. PATENT DOCUMENTS

| | | |
|---|---|---|
| 3,212,569 | 10/1965 | McAdam . |
| 3,290,564 | 12/1966 | Wolff, Jr. . |
| 3,965,277 | 6/1976 | Guditz et al. . |
| 4,151,543 | 4/1979 | Hayakawa et al. . |
| 4,684,975 | 8/1987 | Takiar et al. . |
| 4,942,497 | 7/1990 | Mine et al. . |
| 4,961,106 | 10/1990 | Butt et al. ............................. 257/710 |
| 5,050,040 | 9/1991 | Gondusky et al. . |
| 5,105,259 | 4/1992 | McShane et al. . |
| 5,157,478 | 10/1992 | Ueda et al. . |
| 5,172,213 | 12/1992 | Zimmerman . |
| 5,181,097 | 1/1993 | Ogata et al. ............................. 257/788 |
| 5,200,809 | 4/1993 | Kwon . |
| 5,202,288 | 4/1993 | Doering et al. . |
| 5,208,188 | 5/1993 | Newman . |
| 5,225,499 | 7/1993 | Kokaku et al. ......................... 257/788 |
| 5,227,662 | 7/1993 | Ohno et al. . |
| 5,229,643 | 7/1993 | Ohta et al. . |
| 5,252,855 | 10/1993 | Ogawa et al. . |
| 5,262,927 | 11/1993 | Chia et al. . |
| 5,328,870 | 7/1994 | Marrs . |
| 5,358,904 | 10/1994 | Murakami et al. ..................... 438/118 |
| 5,367,196 | 11/1994 | Mahulikar et al. . |
| 5,381,042 | 1/1995 | Lerner et al. . |
| 5,444,025 | 8/1995 | Sono et al. . |
| 5,455,462 | 10/1995 | Marrs . |
| 5,703,398 | 12/1997 | Sono et al. ............................. 257/675 |

FOREIGN PATENT DOCUMENTS

| | | |
|---|---|---|
| 0 164 794 A2 | 12/1985 | European Pat. Off. . |
| 0 436 126 A2 | 7/1991 | European Pat. Off. . |
| 54-124678 | 9/1979 | Japan . |
| 56-122134 | 9/1981 | Japan . |
| 57-136352 | 8/1982 | Japan . |
| 58-12341 | 1/1983 | Japan . |
| 59-207645 | 11/1984 | Japan . |
| 60-223136 | 11/1985 | Japan ........................... 257/675 |

(List continued on next page.)

Primary Examiner—David Graybill
Assistant Examiner—Alonzo Chambliss
Attorney, Agent, or Firm—Oliff & Berridge, PLC

[57] ABSTRACT

A resin sealing type semiconductor device has first and second heat radiating portions located on opposite sides of a semiconductor element. The first heat radiating portion has an element placing surface. A plurality of leads are disposed at a given distance from the semiconductor element, and connected to the electrode pads through wires. The second heat radiating portion is located in non-contact with the semiconductor element, leads and wires. A first insulating portion is located between the first heat radiating portion and the leads. A second insulating portion is located between the second heat radiating portion and the leads. Preferably, the first insulating portion is formed continuously on one side of the first heat radiating portion, and the second insulating portion on one side of the second heat radiating portion. A space enclosed by these insulating and heat radiating portions houses the semiconductor element, the wires and the tips of the leads.

14 Claims, 10 Drawing Sheets

FOREIGN PATENT DOCUMENTS

| | | |
|---|---|---|
| 62-97358 | 5/1987 | Japan . |
| 63-179557 | 7/1988 | Japan . |
| 63-240053 | 10/1988 | Japan . |
| 2-137249 | 5/1990 | Japan ................................ 257/675 |
| 2-307251 | 12/1990 | Japan . |
| 3-222464 | 10/1991 | Japan . |
| A-3-280453 | 12/1991 | Japan . |
| 4-10558 | 1/1992 | Japan . |
| 4-11758 | 1/1992 | Japan . |
| 4-27145 | 1/1992 | Japan . |
| 6-53390 | 2/1992 | Japan . |
| 4-91458 | 3/1992 | Japan . |
| 4-158556 | 6/1992 | Japan . |
| 4-174551 | 6/1992 | Japan . |
| 4-199664 | 7/1992 | Japan . |
| 4-230056 | 8/1992 | Japan . |
| 6-66351 | 8/1992 | Japan . |
| 4-316357 | 11/1992 | Japan . |
| 5-160304 | 6/1993 | Japan . |
| 5-211262 | 8/1993 | Japan . |
| 6-097321 | 4/1994 | Japan ................................ 257/190 |
| 6-097326 | 4/1994 | Japan ................................ 257/190 |
| 88/07761 | 10/1988 | WIPO ................................ 257/675 |

METHOD OF MAKING A MULTIPLE HEAT SINK RESIN SEALING TYPE SEMICONDUCTOR DEVICE

This is a Division of application Ser. No. 08/358,621 filed Dec. 14, 1994 U.S. Pat. No. 5,594,282.

BACKGROUND OF THE INVENTION

1. Field of the Invention

The present invention relates to a resin sealing type semiconductor device having a heat radiator and a method of making such a semiconductor device.

2. Description of the Related Art

In recent years, Integrated Circuit chips are produced in larger scales, and the output is increased. With this trend the heat radiation in the resin sealing needs to be improved for inherently protecting semiconductor chips. To meet such an end, attempts have been made to increase the thermal conductivity of lead frame and sealing resin in the light of material, and in light of the structure to improve the heat radiating characteristic by changing the design of lead frame and/or adding a heat radiator. Particularly, the improvement of the heat radiating characteristic by adding a heat radiator is the most orthodox measure for LSIs in which the power consumption is no more than about 2 watts per chip.

A semiconductor element requiring an increased heat radiating characteristic is normally larger in size. In the conventional resin sealing type semiconductor devices, thus, it may result in cracking the element or damaging the electrical connection from a difference in thermal expansion coefficient between the element and the sealing resin. Therefore, that the reliability of the element is insufficient.

Further, in the conventional resin sealing type semiconductor devices, the process of injection molding the resin tends to deform the lead or bonding wire from the pressure of injected resin, and causes a failure in electrical connection.

SUMMARY OF THE INVENTION

It is therefore an object of the present invention to provide a resin sealing type semiconductor device having an increased heat radiating characteristic, and a method of making the same.

A further object of the present invention is to provide a resin sealing type semiconductor device which can prevent the semiconductor element or its bonding wires from being damaged from a difference in thermal expansion coefficient between the semiconductor element and the sealing resin and which has a high reliability, and a method of making the same.

A still further object of the present invention is to provide a resin sealing type semiconductor device which can prevent its bonding wires from being deformed from the pressure of injected resin on molding and which can stabilize the quality of products and reduces the defects in products, and a method of making the same.

To this end, the present invention provides a resin sealing type semiconductor device comprising:

a first heat radiating portion having an element placing surface;

a semiconductor element bonded onto said element placing surface of said first heat radiating portion;

a plurality of leads disposed at a given distance from said semiconductor element;

wires for electrically connecting said leads to electrodes of said semiconductor element;

a second heat radiating portion located opposite to said first heat radiating portion and disposed in non-contact with said semiconductor element, leads and wires;

a first insulating portion located between said first heat radiating portion and said leads;

a second insulating portion located between said second heat radiating portion and said leads; and a resin sealing portion formed at least on the exterior of said first, second heat radiating portions and said first, second insulating portions.

Such a semiconductor device can provide an increased heat radiation, since the first and the second heat radiating portions are located on each side of the semiconductor element radiating the heat so as to face each other.

The first and the second heat radiating portions and the first and the second insulating portions form a room (space). This room contains said semiconductor element, the tip ends of the leads and the wires so that the element area including these components is formed to be separated from the resin sealing portion. When the first and the second insulating portions are formed continuously and positioned relative to each other, the room can be closed substantially stopping a liquid penetration. Therefore, on molding the resin sealing portion, the resin does not enter the room. This can prevent the wires from being deformed and/or cut by the pressure of resin. In this way, a semiconductor device having a high reliability can be formed with an increased yield.

If an inert gas such as argon or nitrogen is encapsulated in the room, any degradation of electrically insulating portion due to oxidation can also be prevented.

It is also preferred that at least the element forming surface of the semiconductor element in the resin sealing type semiconductor device is coated with a resin layer. This can prevent, for example, the degradation of the connections between the wires and the semiconductor element electrode parts or the degradation of the element characteristics due to any external gas or moisture penetrating into the semiconductor element.

It is preferred that the resin layer covers the entire area including the semiconductor element surface and all the electric connections such as the connections between the wires and the leads. It is further preferred that the space is substantially fully filled with the resin. Preferably, the resin layer charged into the room has a thermal expansion coefficient which is substantially equal to that of the semiconductor element. For example, the linear expansion coefficient of the resin may range between $1.0 \times 10^{-6}$ cm/°C. and $2.0 \times 10^{-5}$ cm/°C. This can reduce the thermal stress between the semiconductor element and the resin covering it, preventing any problem as crackings in the semiconductor element and/or damages in the electric connections.

The resin forming said resin layer may be of such a soft resin that the thermal stress is hardly created in the contact area between the resin and the surface of the semiconductor or may be of a flowable resin. The material of resin layer formed in the room according to the present invention is not only a single resin material, but also any resin composition which comprises a resin material and any other additives, for example, inorganic powders such as powdered silicon and elastics for reducing stress such as silicone resin.

By coating the element area with the resin layer in such a manner, the degradation in the element forming surface and the electric connections of the semiconductor element can be prevented.

Conventionally, the resin sealing portion comprises a resin material whose linear expansion coefficient ranges between $1.0\times10^{-5}$ and $2.0\times10^{-5}$ cm/°C., preferably $1.3\times10^{-5}$ and $1.6\times10^{-5}$ cm/°C.

The geometric configuration of the heat radiating portions is not particularly restricted, but preferably comprises an enlarged-diameter base and a protruding portion whose external diameter is smaller than that of the base, the protruding portion having a surface exposed to the outside. Thus, since the surface area of the heat radiating portions can be enlarged, the heat from the semiconductor element is dispersed more efficiently through the heat radiating portions, and is released to outside through the exposed surface of the resin sealing portion. In such an arrangement, the distance between the semiconductor element placing surface and the exposed surface of the resin sealing portion can be increased, and thus prevents the penetration of any gas or moisture which hinders the semiconductor element and wiring. When the enlarged-diameter bases of the heat radiating portions are located opposite to each other, the room containing the element area can be formed.

It is preferable that at least one of the heat radiating portions has a peripheral protrusion formed therein continuously on the side facing the semiconductor element, the corresponding insulating portion being formed on the peripheral protrusion. The peripheral protrusion can support the insulating portion generally formed of resin.

The heat radiating portions may take any one of various configurations. For example, at least one of the heat radiating portions may preferably form a corrosion inhibiting layer on the exposed surface and from a metal different from that of the heat radiating portion. When a heat radiating portion is formed of copper and the corrosion inhibiting layer is formed of nickel, the exposed surface can be prevented from being corroded. It is further preferred that at least one of the heat radiating portions includes a recess formed in the exposed surface of the peripheral protrusion. The formation of such a recess is advantageous as it expands the surface area of the exposed portion, thus improving the heat radiation.

A method of making a resin sealing type semiconductor element according to the present invention comprises the steps of:

(a) fixing a first heat radiating portion, a first insulating portion and a lead frame including a plurality of leads on top of one another, bonding a semiconductor element to an element placing surface and electrically connecting said leads to electrodes of said semiconductor element through wires;

(b) providing a second insulating portion at a position opposite to said first insulating portion and fixing said second insulating portion and a second heat radiating portion, so that a space enclosed by said first, second heat radiating portions and said first, second insulating portions accommodates at least said semiconductor element, wires and lead tips of said leads; and (c) molding a resin to form a resin sealing portion around at least the exterior of said first, second heat radiating portions and said first, second insulating portions.

According to such a method, the semiconductor device of the present invention can be produced more effectively.

It is preferred that a resin layer is formed in the space (or room) enclosed by the heat radiating portions and the insulating portion according to any one of the following processes.

One process is to form a resin injecting aperture through at least one of the heat radiating portions, preferably the upper heat radiating portion, and after the (b) step inject the resin into the room through the aperture to form a resin layer.

In such a case, it is preferred that the resin layer is formed so as to cover at least the semiconductor element forming surface and electrical connections between the semiconductor element and the wires, and the resin material is substantially fully charged into the room. Preferably, a plurality of such apertures are formed through the heat radiating portion so that resin may be injected into at least one aperture while the air in the room may be released through at least one remaining aperture, thus facilitating the resin injection.

Another process is to apply resin to the element area by potting after the (a) step, and form a resin layer.

As it is described, the resin layer thus formed preferably has its thermal expansion coefficient substantially equal to that of the semiconductor element.

DETAILED DESCRIPTION OF THE PREFERRED EMBODIMENTS

Some preferred embodiments of the present invention will now be described with reference to the drawings.

First Embodiment

Figure 1:
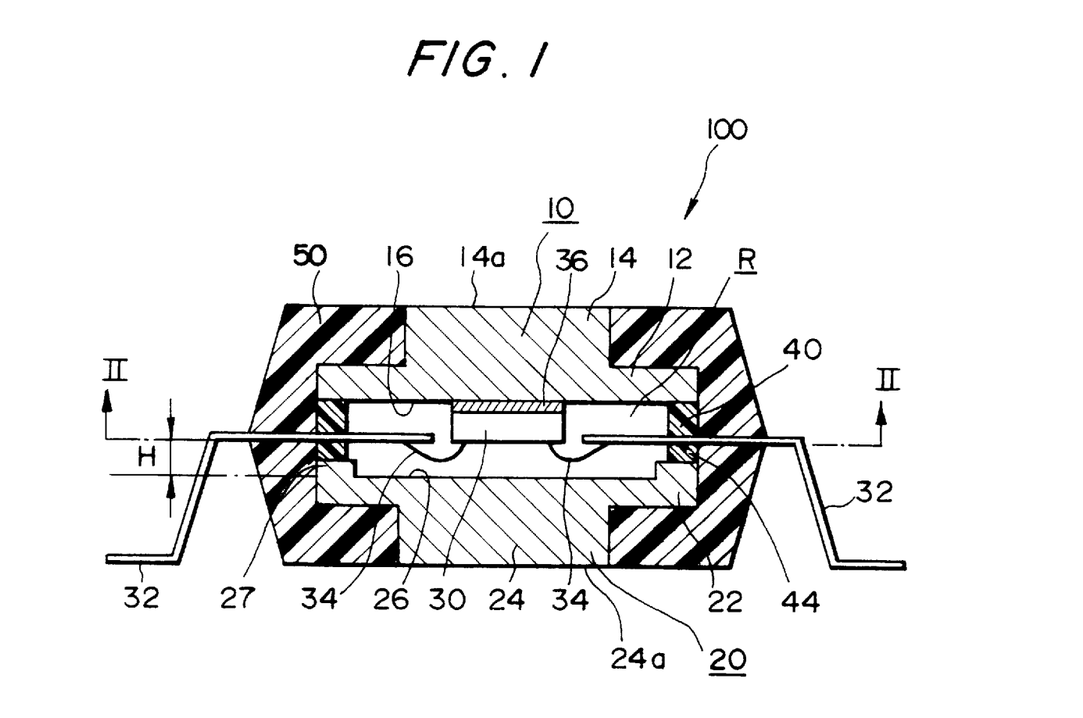
FIG. 1 is a longitudinal sectional view diagrammatically showing a resin sealing type semiconductor device of the first embodiment constructed in accordance with the present invention.
Figure 2:
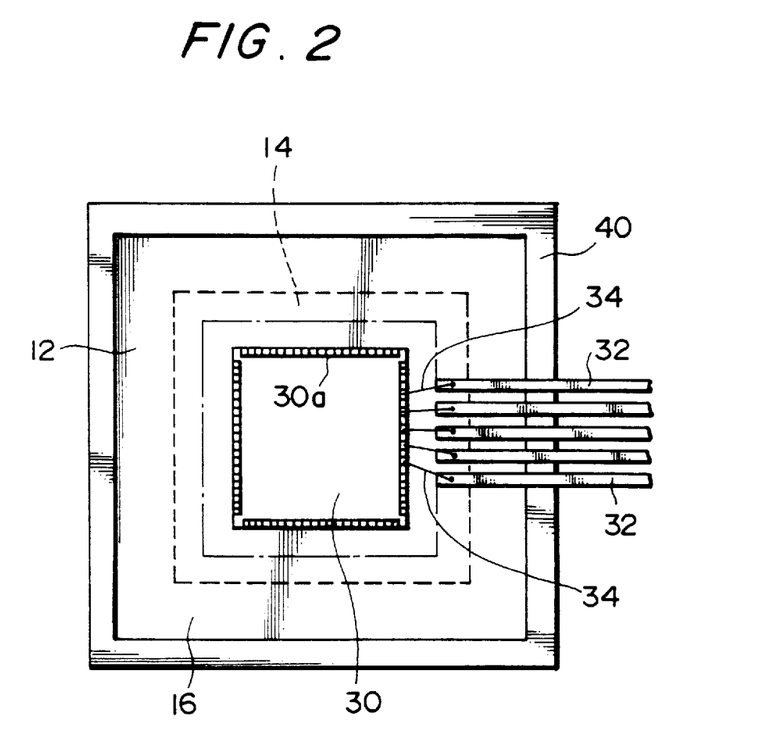
FIG. 2 is a plan view of the semiconductor device as viewed along a line II—II in FIG. 1, omitting the resin sealing portion thereof.

FIG. 1 is a longitudinal sectional view diagrammatically showing a resin sealing type semiconductor device 100 according to the first embodiment of the present invention. FIG. 2 is a plan view of the semiconductor device as viewed along a line II—II in FIG. 1, omitting the resin sealing portion thereof.

The semiconductor device 100 comprises first and second heat radiating portions 10, 20 which are a given distance from each other, having a first insulating portion 40, leads 32 and a second insulating portion 44 in between.

The first heat radiating portion 10 has an enlarged-diameter base 12 and a protruding portion 14 whose diameter is smaller than that of the base 12. The protruding portion 14 is located substantially at the center of the base 12. The side of the base 12 opposite to the protruding portion 14 defines an element placing surface 16 on which a semiconductor element 30 is bonded substantially at the center through an adhesive layer 36 such as silver paste. A top surface 14a of the protruding portion 14 defines an exposed surface.

The second heat radiating portion 20 is of substantially the same structure as that of the first heat radiating portion 10, having an enlarged-diameter base 22 and a protruding portion 24 whose diameter is smaller than that of the base 22. The peripheral edge of surface 26 of the base 22 opposite to the protruding portion 24 is formed with a peripheral protruding portion 27 which can reliably support the insulating portions 40 and 44 normally formed of flexible resin material.

It is desirable that these heat radiating portions 10 and 20 are formed of a high heat conductive material such as copper, aluminum, silver, gold or any one of their alloys. In light of economy, copper is most desirable.

Each of said leads 32 is disposed a given distance from the semiconductor element 30, and the portion of each of the leads 32 inwardly spaced from the tip thereof is supported by the first and the second insulating portion 40, 44 from the opposite sides thereof. The leads 32 are electrically connected to electrode pads 30a (see FIG. 2) in the semiconductor device 30 through gold or silver wires (bonding wires) 34.

As shown in FIG. 2, the first insulating portion 40 is formed continuously along the peripheral edge of the element placing surface 16 in the first heat radiating portion 10. Similarly, the second insulating portion 44 is continuously formed along the peripheral edge of the surface 26 of the second heat radiating portion 20 facing the semiconductor element 30. The first and the second insulating portions 40, 44 are required to have sufficiently electrical insulations, to support the leads 32 stably, to have thickness sufficient to secure spaces that the tips of the leads 32(inner leads) and wires 34 do not contact the first or the second heat radiating portion (10 or 20) and to reduce any deformation and/or transformation during the thermal processing.

The first and the second insulating portions 40, 44 may be formed of any insulating resin, for example, a thermosetting resin such as polyamide resin, epoxy resin or the like. The first and the second insulating portions 40, 44 are preferably formed of a tape-like member of said resin.

Thus, the first and the second heat radiating portions 10, 20 and the first and the second insulating portions 40, 44 form a room R within which the semiconductor element 30, the tips of the leads 32 and the wires 34 are located. The room R is closed to such a degree that it blocks resin flowing in while a resin sealing portion 50 is formed.

If the room R is filled with an inert gas such as nitrogen or argon, the electrical connections or the like can be prevented from being damaged by oxidation.

The resin sealing portion 50 is formed so as to expose the surfaces 14a and 24a of the first and the second heat radiating portions 10, 20. As described, the resin sealing portion 50 is of such a structure that the resin will not flow into the room R in which the semiconductor element 30 is present.

Considering the above matters, as an example the following numeral values may be included in a rule of designing.

Thickness of Leads 32: 0.1 to 0.2 mm;

Thickness of Second Insulating Portion 44: 0.01 to 0.15 mm;

Thickness of Semiconductor Element 30 and Adhesive Layer 36: 0.3 to 0.7 mm;

Height of Wires 34 (Distance between the surface of the semiconductor element 30 and the top of the wires 34): 0.15 to 0.4 mm;

Distance between the surface 26 of the second heat radiating portion 20 and the leads 32 (shown by H in FIG. 1): 0.1 to 0.99 mm.

In such an arrangement, the semiconductor device 100 provides the following functions and advantages.

(1) By mainly bonding the semiconductor element 30 which generates the heat to the first heat radiating portion 10, while providing the second heat radiating portion 20 opposite to the portion 10, the heat radiation can be improved. In this embodiment, the heat radiation is further improved since the surfaces 14a and 24a of the heat radiating portions 10 and 20 are exposed from the resin sealing portion 50.

Since the heat radiating portions 10 and 20 are of substantially T-shaped cross-section, the surface area of the portions 10 and 20 can be expanded to improve the heat radiation. Further, the distance between the surface 14a or 24a and the element placing surface 16 on which the semiconductor element 30 is located can be increased, and limit the degradation of element characteristics due to penetration of any external gas or moisture into the room.

(2) Since the element area containing the semiconductor element 30, the tips of the leads 32 and the wires 34 is housed within the room R to separate the element area from the resin sealing portion 50, the wires can be prevented from being deformed and/or cut by the pressure from the flow of molten resin, when the resin sealing portion 50 is being formed. This enables the semiconductor device to be formed with an increased reliability and yield.

(3) Since the element area is housed within the room R does not provide a resin layer which comprises the resin sealing portion 50 around the semiconductor element, the semiconductor element can be prevented from being cracked due to a difference in thermal expansion coefficient between the resin and the semiconductor element. Thus, the semiconductor device can be produced with an increased reliability with the passage of time.

If the room R is filled with an inert gas such as nitrogen or argon, the electrical connections or the like can be prevented from being damaged by oxidation.

A production process of the resin sealing type semiconductor device 100 will now be described.

Figure 3A:
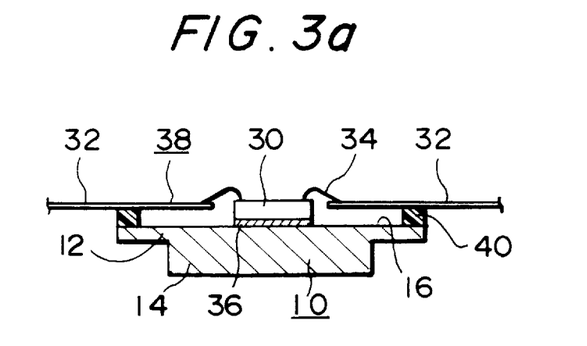
FIGS. 3A to 3C are longitudinal sectional views of the semiconductor device shown in FIG. 1, diagrammatically illustrating the production process.
Figure 3B:
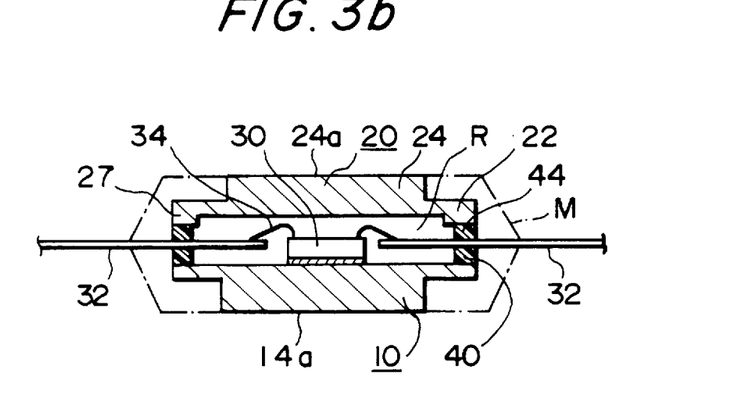
Figure 3C:
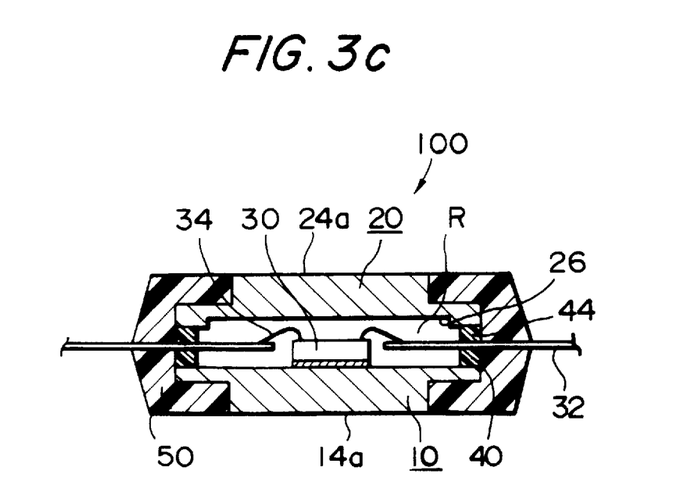

FIGS. 3A to 3C are schematic cross-sectional views illustrating a production process of the semiconductor device 100 according to the first embodiment.

(a) As shown in FIG. 3A, the semiconductor element 30 is first bonded to the designated position of the element placing surface 16 of the first heat radiating portion 30 through the adhesive layer 36 such as silver paste. As clearly shown in FIG. 2, the first insulating portion 40 is then disposed on the element placing surface 16 of the first heat radiating portion 10 along the peripheral edge of the surface 16. A lead frame 38 including the leads 32 is further disposed on the first insulating portion 40. The first heat radiating portion 10, the first insulating portion 40 and the lead frame 38 are then bonded together by thermo-compression through an adhesive such as epoxy resin or the like, and are fixed.

However, the process and the sequence of bonding together the first heat radiating portion 10, the semiconductor element 30, the first insulating portion 40 and the lead frame 38 are not restricted to the aforementioned process and sequence.

The electrode pads 30a of the semiconductor element 30 are electrically connected to the respective leads 32 through the wires 34 in a given wiring pattern.

(b) As shown in FIG. 3B, the second insulating portion 20 is then adhered to a position opposite to the first heat radiating portion 10 through the second insulating portion 44. At this point, the second insulating portion 44 must be superimposed on the first insulating portion 40.

In this step, an internal room R is formed by the first heat radiating portion 10, the second heat radiating portion 20, the first insulating portion 40 and the second insulating portion 44. Thus, the semiconductor element 30, the tips of the leads 32 and the wires 34 will be included in the room R. The leads 32 are sandwiched and supported by the first and second insulating portions 40, 44 located above and beneath the leads 32 respectively.

It is desirable that this step is accomplished in an inert gas atmosphere such as nitrogen or argon so that the room R is filled with the inert gas.

(c) As shown in FIG. 3C, the resin sealing portion 50 is formed through the conventional molding means. The fluid resin composition for forming the resin sealing portion 50 is not injected into the room R. The surfaces 14a and 24a of the first and the second heat radiating portions 10, 20 remain exposed from the resin sealing portion 50.

More particularly, the assembly formed as shown in FIG. 3B is set in a mold M with the surfaces 14a and 24a of the heat radiating portions 10 and 20 touching the top and bottom surfaces of the mold M. After the molding step, therefore, the surfaces 14a and 24a of the heat radiating portions 10, 20 are exposed from the resin sealing portion 50.

As for the lead frame 38, a frame and dam bars are cut using conventional means. If required, externally extending lead portions (outer leads) may be shaped.

Second Embodiment

Figure 4:
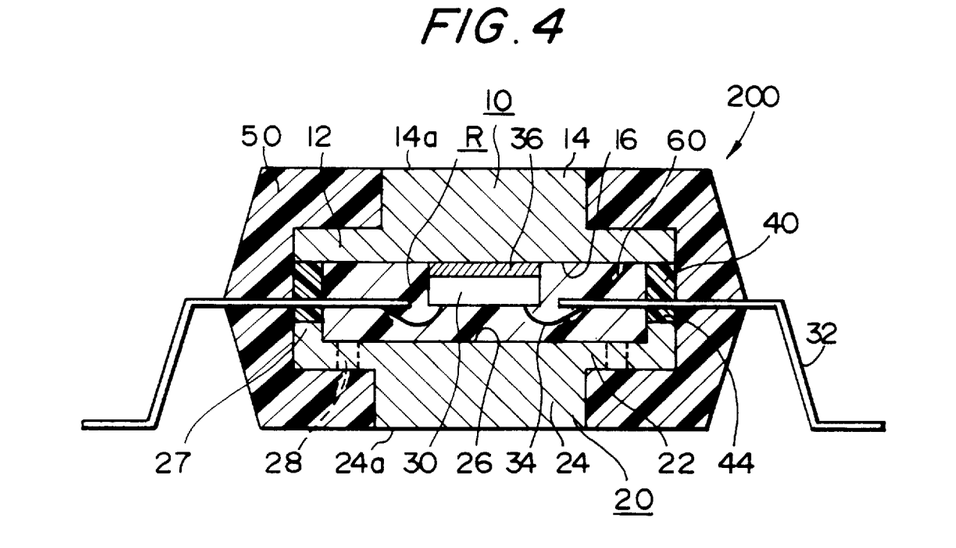
FIG. 4 is a longitudinal sectional view diagrammatically showing a semiconductor device of the second embodiment constructed in accordance with the present invention.
Figure 5:
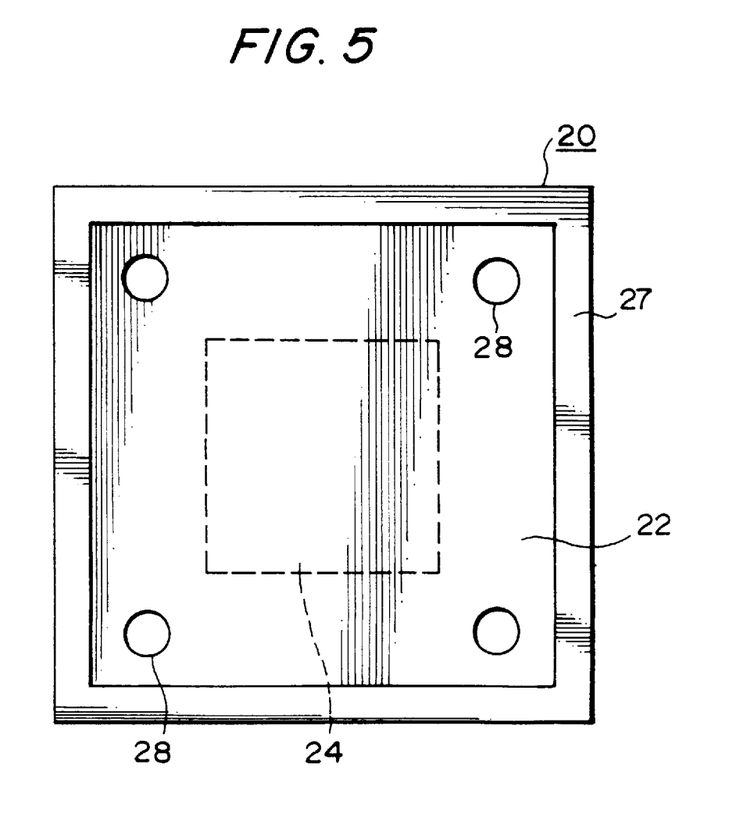
FIG. 5 is a diagrammatical plan view of the second heat radiating portion in the semiconductor device of FIG. 4.

A semiconductor device 200 constructed according to the second embodiment will be described with reference to FIGS. 4 and 5. In these figures, parts having substantially the same functions as those of the semiconductor device 100 according to the first embodiment are designated by similar reference numerals and will not further be described.

The basic structure of the resin sealing type semiconductor device 200 is substantially the same as that of the semiconductor device 100 of the first embodiment. The semiconductor device 200 is different from the semiconductor device 100 only in that a resin layer (internal resin sealing portion 60) is formed in the room R defined by the first heat radiating portion 10, the second heat radiating portion 20, the first insulating portion 40 and the second insulating portion 44. The internal resin sealing portion 60 serves as means for preventing the penetration of any external gas, for example, corrosive and oxidative gases as oxygen and halogen, and/or moisture into the element area and thus the degradation of element characteristics. Further, in view of the reliability of the semiconductor device and its production process, it is desirable to form the internal resin sealing portion 60 throughout the entire room R.

The resin material forming the internal resin sealing portion 60 preferably has its thermal expansion coefficient substantially equal to that of the semiconductor element 30. For example, a resin whose linear expansion coefficient ranges between $1.3 \times 10^{-5}$ cm/°C. and $1.6 \times 10^{-5}$ cm/°C. is ideal. Resins such as epoxy resin, silicone resin and the like whose linear expansion coefficients fall within the above range can form the internal resin sealing portion 60. Therefore, any thermal stress from a difference of thermal expansion coefficient between the semiconductor element 30 and the internal resin sealing portion 60 can be restrained, and any damage in the semiconductor element 30 or its electrical connections are avoided.

Although the resin forming the internal resin sealing portion 60 is preferably selected from resin materials whose linear expansion coefficients fall within the above range, the present invention is not limited to such materials. A resin generating least thermal stress, a resin such as silicone resin having a higher plasticity or a flowable resin may be used. Furthermore, a resin similar to that of the resin sealing portion 50 may be used although it is inferior in thermal stress. This is because the volume of the room R in which the internal resin sealing portion 60 is formed is smaller than that of the resin sealing portion 50, and also the interior of the room R is partitioned, thereby reducing the pressure generated when the resin is injected into the room R and preventing the deformation and damage of the wires.

In this embodiment, one or a plurality of apertures is formed through at least one of the heat radiating portions, preferably the one which is located upper side of the cavity (second heat radiating portion 20 in this embodiment). It is preferred that a plurality of such apertures are formed through that heat radiating portion. FIG. 5 is a plan view of the second heat radiating portion 20 as viewed from the side of the base 22. In this embodiment, four resin pouring apertures 28 are formed through the heat radiating portion 20 at its corners on the diagonal lines. By injecting the resin material into the room R through one to three apertures and expelling the air from the room R through at least one aperture, the inflow of the resin is facilitated.

If the internal resin sealing portion 60 is to be formed at the same time as the resin sealing portion 50, it is preferable that the resin pouring apertures are formed through the first and second heat radiating portions 10, 20.

The aforementioned semiconductor device 200 has the following functions and advantages.

(1) By locating the first and the second heat radiating portions 10, 20 on the opposite sides of the semiconductor element 30 as in the semiconductor device 100 of the first embodiment, the heat radiation can be improved. When the surfaces 14a and 24a of the heat radiating portions 10, 20 are exposed from the resin sealing portion 50, the heat radiation can further be improved.

By forming the heat radiating portions 10 and 20 into substantially T-shaped cross-section as in the semiconductor device 100, the surface area of the heat radiating portions 10 and 20 can be expanded, thus improving the heat radiation. At the same time, the distance from the surface 14a or 24a to the semiconductor element 30 can be increased to limit the degradation of element characteristics due to penetration of any external gas and/or moisture into the room.

(2) Since the internal resin sealing portion 60 is formed in the room R defined by the first heat radiating portion 10, the second heat radiating portion 20, the first insulating portion 40 and the second insulating portion 44, any external gas and/or moisture can be prevented from penetrating into the element area, thus limiting the degradation of element characteristics. When the resin material forming the internal resin sealing portion 60 is a resin whose thermal expansion coefficient is substantially equal to that of the semiconductor element 30, a strain due to the thermal stress produced between the internal resin sealing portion 60 and the semiconductor element 30 is reduced, and particularly the degradation of the semiconductor element can be restrained.

(3) When the above element area is housed in the room R and formed to be separated from the resin sealing portion 50, the volume of the area in which the internal resin sealing portion 60 is formed can be reduced. As a result, the pressure of the resin injected into the mold cavity when the internal resin sealing portion 60 is to be formed can be reduced, limiting the deformation and/or damage of the wires and others due to the resin pressure. The reduction of the volume by forming the internal resin sealing portion 60 while separating from the resin sealing portion 50, can reduce the strain between the internal resin sealing portion 60 and the semiconductor element 30 due to the thermal stress. This also results in prevention of the degradation of element characteristics.

A production process of semiconductor device 200 according to the second embodiment will now be described with reference to FIGS. 6A to 6D.

Figure 6A:
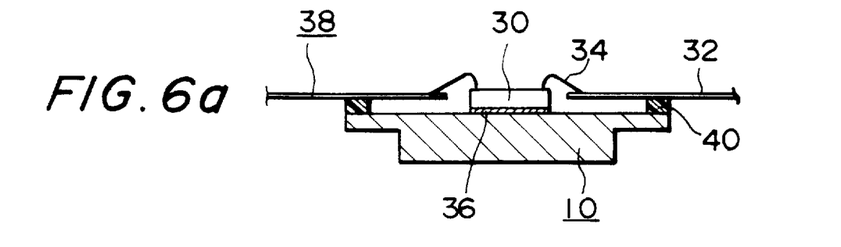
FIGS. 6A to 6D are longitudinal sectional views of the semiconductor device shown in FIG. 4, diagrammatically illustrating the production process thereof.

(a) As shown in FIG. 6A, the first heat radiating portion 10, the semiconductor element 30, the first insulating portion 40 and the lead frame 38 including the leads 32 are first bonded in a given arrangement. The semiconductor element 30 is then bonded to the leads 32 through the wires 34. Such a step corresponds to the step (a) in the first embodiment.

Figure 6B:
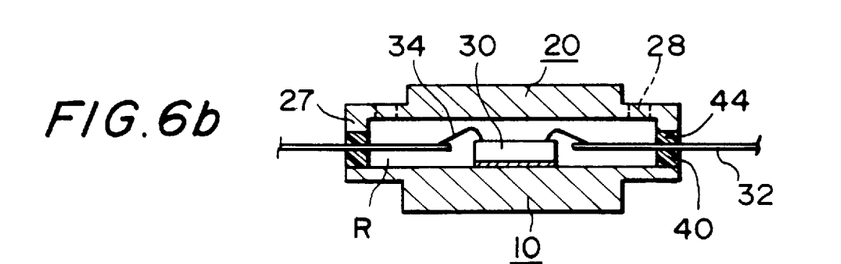

(b) As shown in FIG. 6B, the second heat radiating portion 20 is then fixed at a position opposite to the first heat radiating portion 10 through the second insulating portion 44. This step is similar to the step (b) of the first embodiment.

In this step, the second heat radiating portion 20 is located above the first heat radiating portion 10, while the resin pouring apertures 28 in the second insulating portion 20 communicate with the room R. In this embodiment, it is unnecessary to carry out this step in the inert gas atmosphere as in the first embodiment, since the resin is injected into the room R.

Figure 6C:
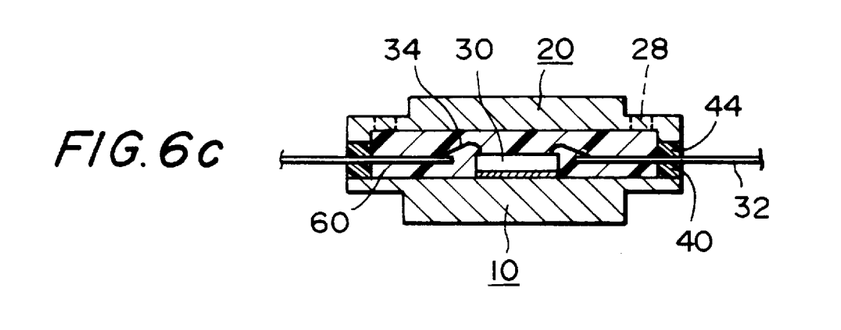

(c). As shown in FIG. 6C, the resin is then injected into the room R through the apertures 28 in the second heat radiating portion 20 to form the internal resin sealing portion 60. At this point, it is preferred that the room R is substantially fully filled with the resin.

Figure 6D:
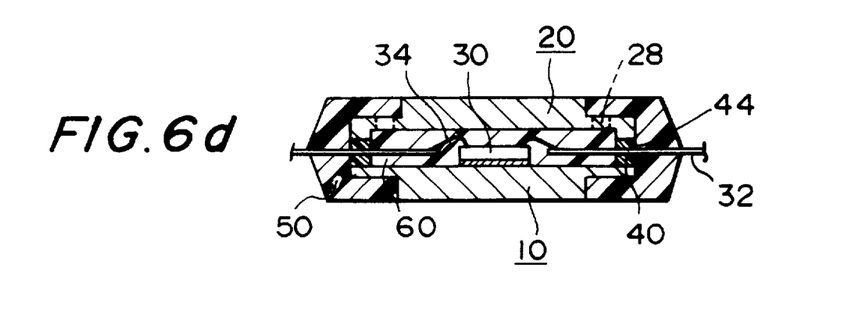

(d). As shown in FIG. 6D, the resin sealing portion 50 is then formed with the conventional molding process. This step is substantially similar to the step (c) in the first embodiment.

If the internal resin sealing portion 60 is to be formed with the step for producing the resin sealing portion 50, the step (c) may be omitted and in the step (d) the resin may be injected into the room R to form the resin sealing portion 50 and internal resin sealing portion 60 at the same time

Third Embodiment

Figure 7:
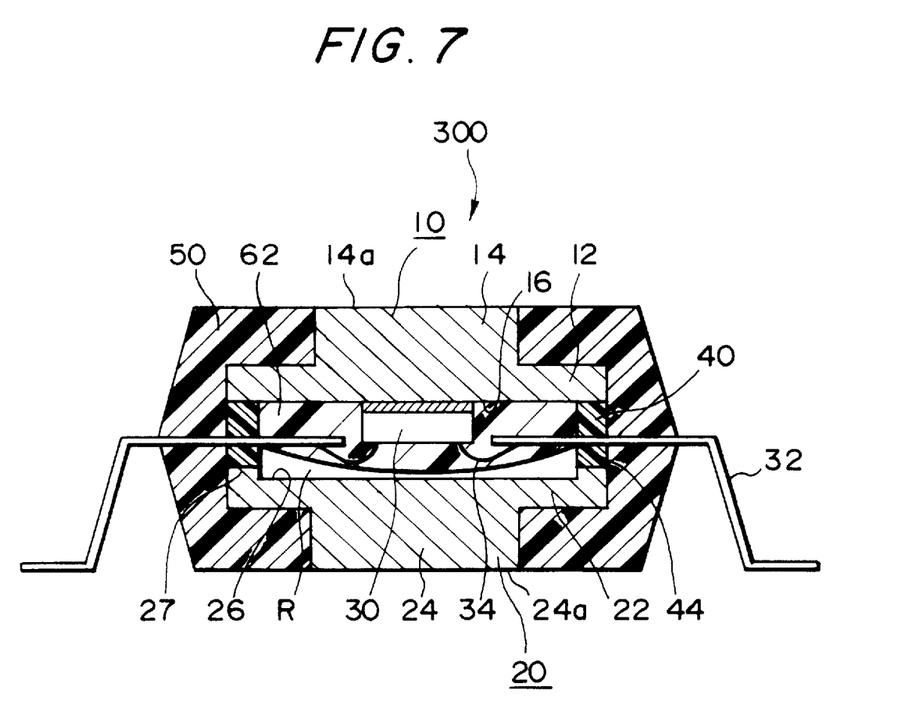
FIG. 7 is a longitudinal sectional view diagrammatically showing a semiconductor device of the third embodiment constructed in accordance with the present invention.

A semiconductor device 300 formed according to the third embodiment will be described with reference to FIG. 7. In this figure, parts having substantially the same functions as in the semiconductor device 200 of the second embodiment are designated by similar reference numerals and will not further be described.

The semiconductor device 300 is different from the semiconductor device 200 of the second embodiment only in that an internal resin sealing portion 62 defined by the first heat radiating portion 10, the second heat radiating portion 20, the first insulating portion 40 and the second insulating portion 44 is not fully formed in the room R. The internal resin sealing portion 62 seals the semiconductor element 30, the wires 34 and the tips of the leads 32, and leaves a space in the room R due to a production process of the internal resin sealing portion 62 which will be described later. However, the function of the internal resin sealing portion 62 is basically equivalent to that of the internal resin sealing portion 60 in the second embodiment. In short, the internal resin sealing portion 62 is only required to cover an area including the connections between the semiconductor element 30 and the wires 34 and between the wires 34 and the leads 32 in which an electrical disconnection is created easily, or at least the element forming surface of the semiconductor element 30.

In the semiconductor device 300 of the third embodiment, it is unnecessary to form any resin pouring aperture through the first and the second heat radiating portions as the internal resin sealing portion 62 is formed prior to the room R which will be described later. It is also preferred that the internal resin sealing portion 62 is of a structure similar to that of the internal resin sealing portion 60 in the second embodiment. For example, it may be substantially equivalent to the semiconductor element 30 in terms of thermal expansion coefficient.

The semiconductor device 300 functions basically in the same manner as the semiconductor device 200 of the second embodiment.

A production process of the semiconductor device 300 of the third embodiment will be described with reference to FIGS. 8A to 8D.

Figure 8A:
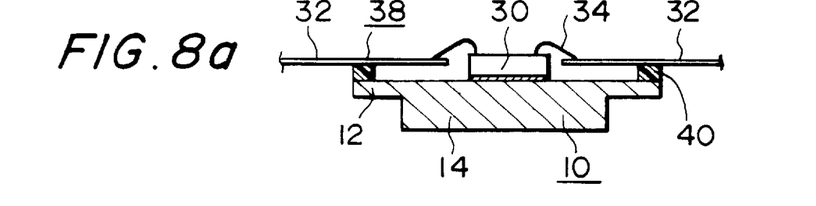
FIGS. 8A to 8D are longitudinal sectional views of the semiconductor device shown in FIG. 7, diagrammatically illustrating the production process thereof.

(a) As shown in FIG. 8A, the first heat radiating portion 10, the semiconductor element 30, the first insulating portion 40 and the lead frame 38 including the leads 32 are first positioned and fixed together. The semiconductor element 30 is then bonded to the leads 32 through the wires 34. This step is similar to the step (a) in the second embodiment.

Figure 8B:
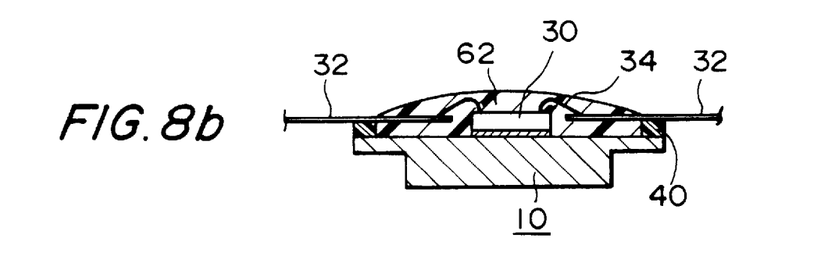

(b). As shown in FIG. 8B, the internal resin sealing portion 62 is then formed in an area including the semiconductor element 30, wires 34 and the tips of leads 32. The internal resin sealing portion 62 may be formed by applying a molten or solution resin by potting or the like. At this point, it is to be noted that the marginal edge of the internal resin sealing portion 62 must not extend beyond the first insulating portion 40 so that the applied resin does not leak outside. If the resin forming the internal resin sealing portion 62 leaks outside from the first insulating portion 40, the subsequent step of bonding the second insulating portion 44 may not be carried out reliably, and thus resulting in an imperfect formation of the room R.

Figure 8C:
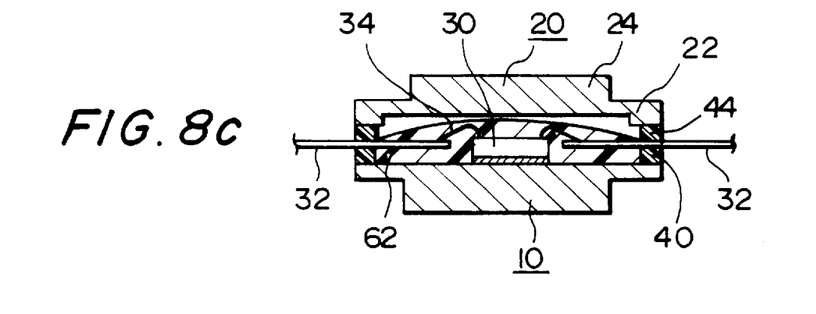

(c). As shown in FIG. 8C, the second heat radiating portion 20 is fixed opposite to the first heat radiating portion 10 through the second insulating portion 44. This step is similar to the step (b) of the second embodiment.

Figure 8D:
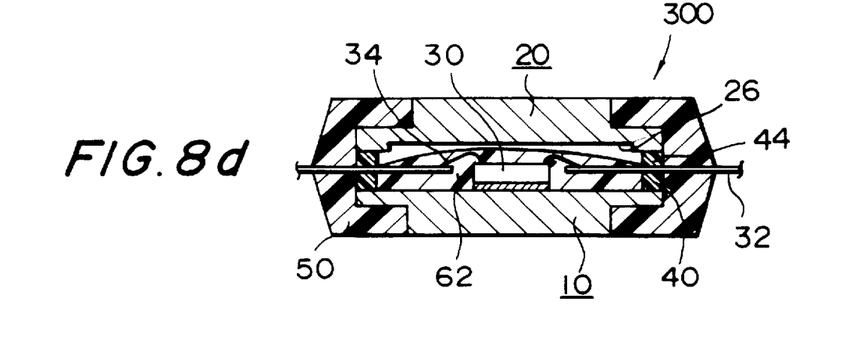

(d). As shown in FIG. 8D, the resin sealing portion 50 is finally formed through the conventional molding means. This step is similar to the step (d) in the second embodiment.

Examples of the modified heat radiating portions are explained hereafter.

Figure 9:
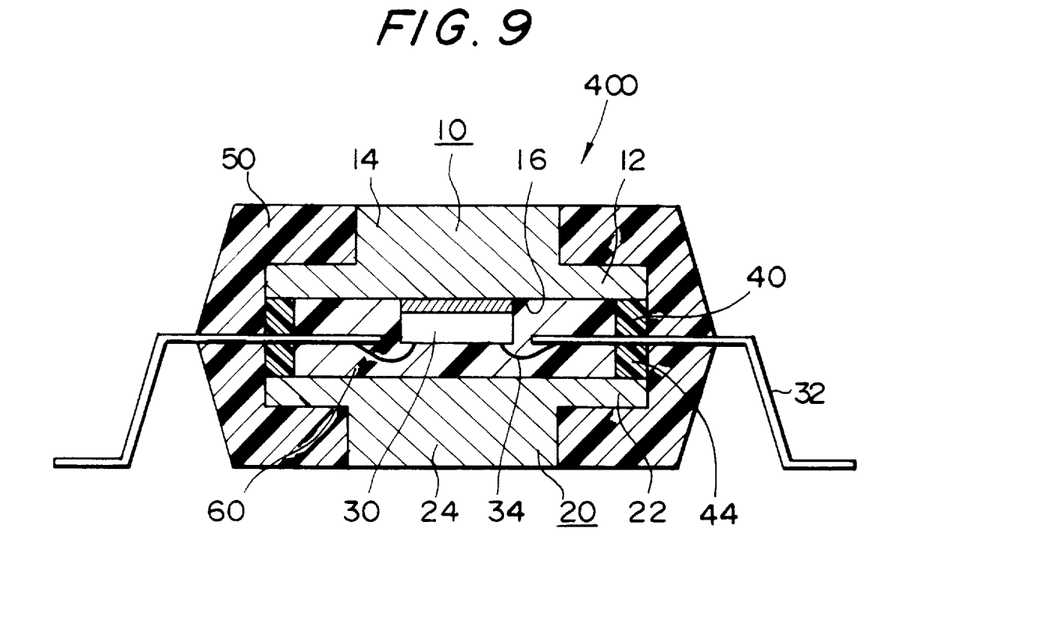
FIG. 9 is a longitudinal sectional view diagrammatically showing a modified heat radiating portion according to the present invention.

The heat radiating portions of a semiconductor device 400 may be modified as shown in FIG. 9.

The heat radiating portions 10 and 20 are of the same configuration, but the second heat radiating portion 20 does not have such a peripheral protruding edge 27 as described in the previous embodiments. In such a case, the first and the second heat radiating portions 10, 20 have the same shape, and is advantageous in terms of requiring minimum number of parts. However, the first and the second insulating portions 40, 44 also functioning as spacers between the first and the second heat radiating portions 10, 20 must be formed of the least deformable material having an increased mechanical strength.

Figure 10:
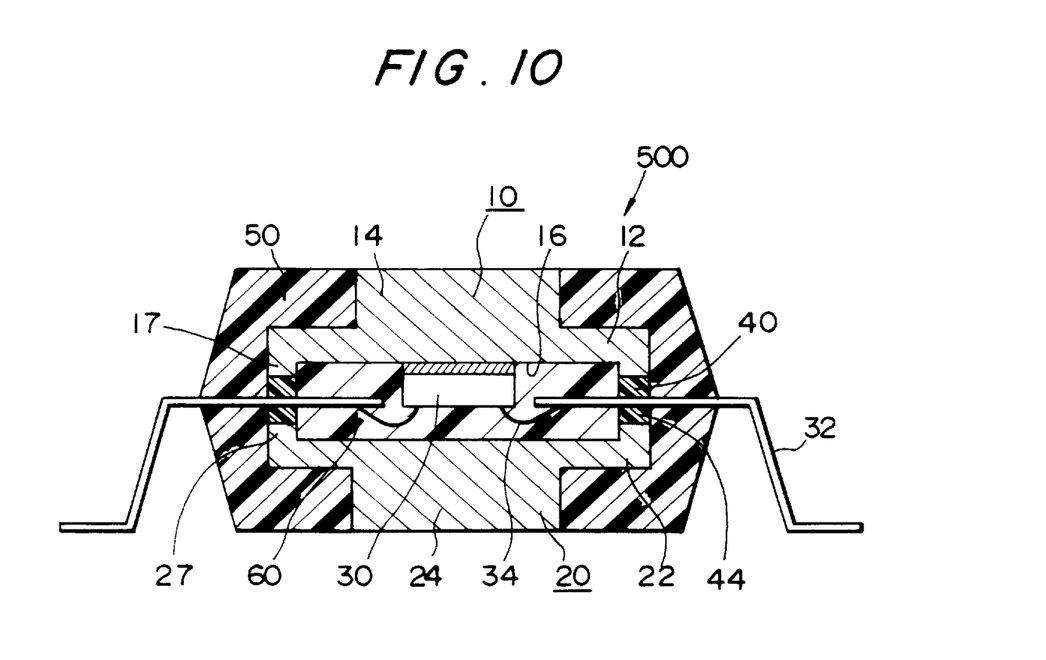
FIG. 10 is a longitudinal section of a modified heat radiating portion according to the present invention.

The heat radiating portions 10, 20 of a semiconductor device 500 as shown in FIG. 10 are of the same configuration, and have peripheral protruding portions 17 and 27, respectively. By providing the peripheral protruding portions to the heat radiating portions, it is possible to set a space between the heat radiating portions 10 and 20.

Figure 11:
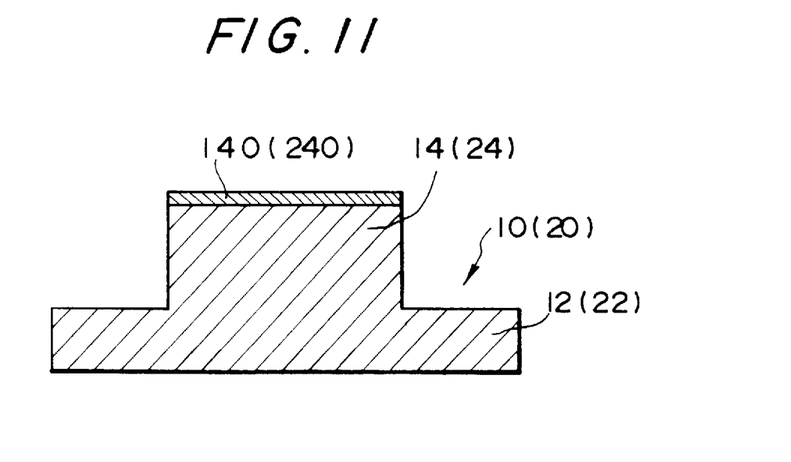
FIG. 11 is a longitudinal section of another modified heat radiating portion according to the present invention.

A heat radiating portion 10 (20) shown in FIG. 11 has a base 12 (22), a protruding portion 14 (24) extending from the base 12 (22) and a corrosion inhibiting layer 14c (24a) formed on top of the protruding portion 14 (24). The corrosion inhibiting layer 14c is of a metal different from those of the base and protruding portion. This may be applied when the heat radiating body portion is formed of relatively inexpensive copper, and the exposed surface thereof tends to be oxidized. By providing the corrosion inhibiting layer 14c (24a) which is formed of nickel or solder, for example, the exposed parts of the heat radiating portions can be prevented from being corroded. The corrosion inhibiting layer may be formed of resin.

Figure 12:
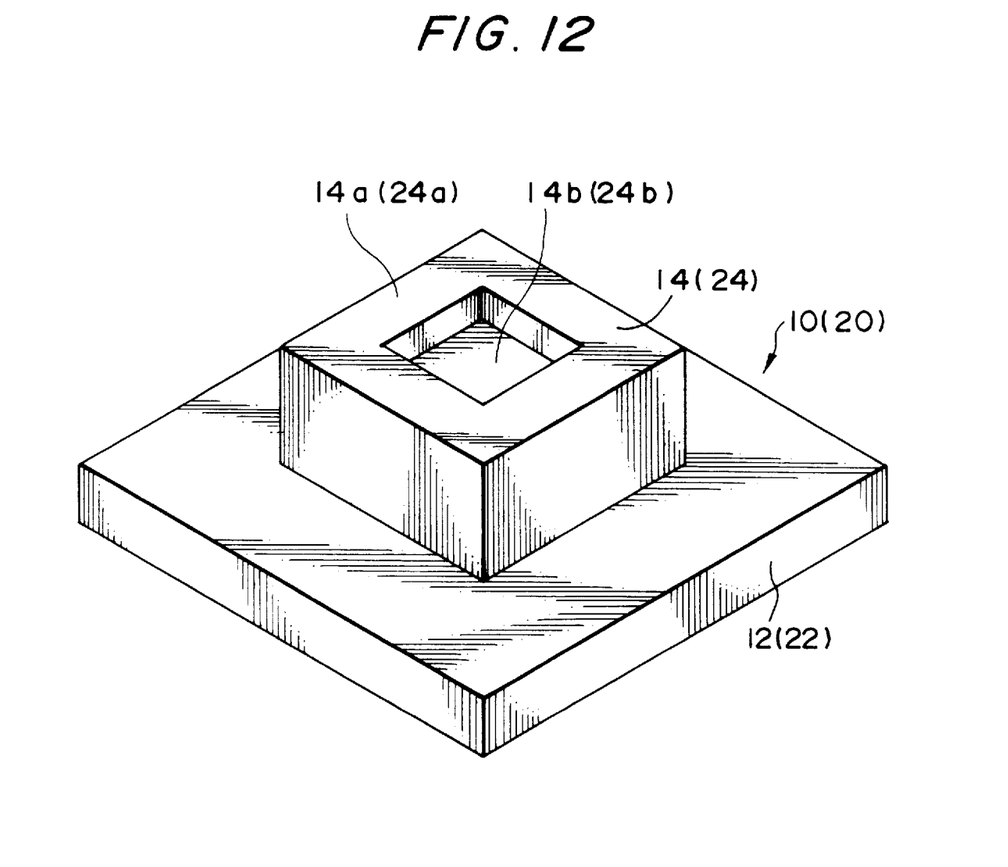
FIG. 12 is a perspective view of still another modified heat radiating portion according to the present invention.

FIG. 12 shows a heat radiating portion 10 (20) in which the end surface (exposed surface) of the protruding portion 14 (24) includes a recess 14b (24b) formed therein substantially at the center. In such a case, the contact area between an exposed end 14a (24a) and the wall of the mold can be reduced on molding. Therefore, the clamping force per unit area of the exposed surface 14a (24a) touching the mold wall and is increased, thus preventing the inflow of resin onto the exposed surface 14a (24a). This can eliminate formation of a so-called burr. The recess 14b (24b) in the heat radiating portion 10 (20) serves to increase the surface area of the exposed surface, thus improves the heat radiation.

Figure 13:
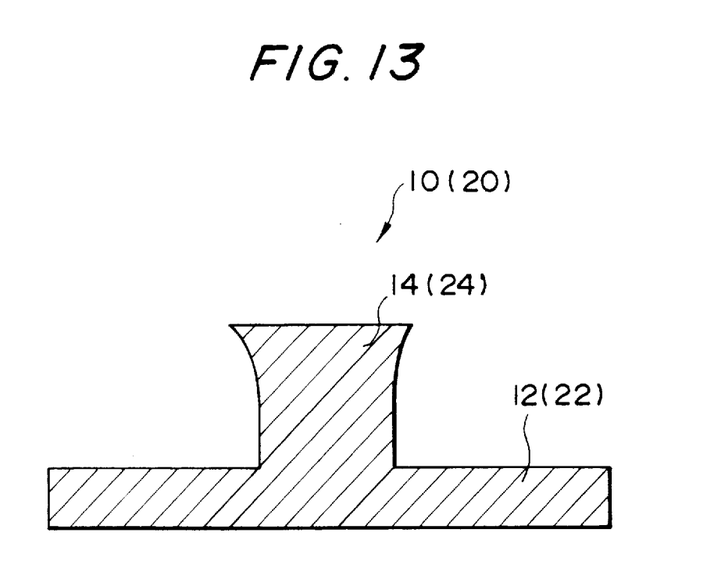
FIG. 13 is a longitudinal section of a modified heat radiating portion according to the present invention.

A heat radiating portion 10 (20) as shown in FIG. 13 has an undercut on the side surface of a protruding portion 14 (24). Providing such undercut strengthens the connection between the heat radiating portion 10 (20) and the resin sealing portion.

The heat radiating portion is not limited to the heat radiating portions and their modifications described in the previous embodiments, but can take any one of various forms as long as it has a wide surface sufficient to form the room R. The heat radiating portions may be of such a type that they are enclosed in the resin sealing portion 50 although its heat radiation is slightly inferior.

The present invention has been described as to some preferred embodiments. Nevertheless, it is not limited to these forms, and may be applied in any one of various other forms within the scope of the invention.

I claim:

1. A method of making a resin sealing type semiconductor element, comprising the steps of:

fixing a first insulating portion between a first heat radiating portion and a plurality of leads;

bonding a semiconductor element to an element placing surface of said first heat radiating portion;

electrically connecting said plurality of leads to electrodes of said semiconductor element through wires;

fixing a second insulating portion between said plurality of leads and a second heat radiating portion, said second heat radiating portion being located opposite to said first heat radiating portion, and not contacting said semiconductor element, said plurality of leads and said wires, such that a space enclosed by said first and second heat radiating portions and said first and second insulating portions accommodates at least said semiconductor element, wires and a portion of each of said plurality of leads; and forming a resin sealing portion around an exterior of said first and second heat radiating portions and said first and second insulating portions.

2. A method as defined in claim 1, wherein at least one of said first and second heat radiating portions includes at least one resin pouring aperture formed therethrough, and wherein after said step of fixing a second insulating portion, a step of partially filling the space with resin is performed by injecting the resin into the space enclosed by said first and second heat radiating portions and said first and second insulating portions through said at least one resin pouring aperture to form a resin layer which covers at least a surface of said semiconductor element.

3. A method as defined in claim 2, wherein said resin layer is formed so that said space is substantially filled with the resin.

4. A method as defined in claim 2, wherein said resin sealing portion is formed simultaneously with said resin layer.

5. A method as defined in claim 2, wherein said step of partially filling the space is performed using a resin having a thermal coefficient of expansion substantially equal to that of the semiconductor element and the resin covers at least the semiconductor element, the wires, and a part of each of the plurality of leads.

6. A method as defined in claim 5, wherein said resin layer has a linear expansion coefficient ranging between $1.0 \times 10^{-6}$ cm/°C. and $2.0 \times 10^{-5}$ cm/°C.

7. A method as defined in claim 1, further comprising a step of forming a resin layer to cover at least a surface of said semiconductor element after performing the step of electrically connecting said plurality of leads to said electrodes.

8. A method as defined in claim 7, wherein said resin layer has a linear expansion coefficient ranging between $1.0 \times 10^{-6}$ cm/°C. and $2.0 \times 10^{-5}$ cm/°C.

9. A method as defined in claim 1, wherein said step of forming a resin sealing portion comprises forming a resin sealing portion such that said first and second heat radiating portions are partially exposed.

10. A method as defined in claim 9, further comprising the step of forming a corrosion inhibiting layer on an exposed portion of at least one of the first and second heat radiating portions.

11. A method as defined in claim 1, wherein said step of forming a resin sealing portion comprises forming the resin sealing portion of a material having a linear expansion coefficient ranging between $1.0 \times 10^{-5}$ cm/°C. and $2.0 \times 10^{-5}$ cm/°C.

12. A method as defined in claim 1, wherein said step of forming a resin sealing portion comprises forming the resin sealing portion of a material having a linear expansion coefficient ranging between $1.3 \times 10^{-5}$ cm/°C. and $1.6 \times 10^{-5}$ cm/°C.

13. A method as defined in claim 1, further comprising the step of filling any empty space between said first and second heat radiating portions and said first and second insulating portions with an inert gas.

14. A method as defined in claim 13, wherein said step of filling any space comprises filling the space with a gas selected from the group consisting of argon and nitrogen.

* * * * *